United States Patent
Pinto et al.

(10) Patent No.: US 8,954,764 B2
(45) Date of Patent: Feb. 10, 2015

(54) METHOD AND APPARATUS FOR DYNAMIC POWER MANAGEMENT

(75) Inventors: Victor Pinto, Zychron Yaakov (IL); Eyal Raz, Even Yehuda (IL)

(73) Assignee: CSR Technology Inc., Sunnyvale, CA (US)

(*) Notice: Subject to any disclaimer, the term of this patent is extended or adjusted under 35 U.S.C. 154(b) by 481 days.

(21) Appl. No.: 13/412,501

(22) Filed: Mar. 5, 2012

(65) Prior Publication Data

US 2013/0232347 A1    Sep. 5, 2013

(51) Int. Cl.
*G06F 1/26* (2006.01)
*G06F 1/32* (2006.01)

(52) U.S. Cl.
USPC ........... 713/300; 713/320; 713/323; 327/524; 327/540

(58) Field of Classification Search
CPC ... G06F 1/3203; G06F 1/3243; G06F 1/3296; G06F 2217/78
USPC .................. 713/300, 320, 323; 327/524, 540
See application file for complete search history.

(56) References Cited

U.S. PATENT DOCUMENTS

| | | | |
|---|---|---|---|
| 7,075,276 B2 | 7/2006 | Morales | |
| 7,245,512 B2 | 7/2007 | Leung et al. | |
| 7,319,358 B2 | 1/2008 | Senthinathan et al. | |
| 7,426,123 B2 | 9/2008 | Leung et al. | |
| 7,426,645 B2 | 9/2008 | Leung et al. | |
| 7,428,159 B2 | 9/2008 | Leung et al. | |
| 7,514,974 B2 | 4/2009 | Block et al. | |
| 7,558,129 B2 | 7/2009 | Thorp et al. | |
| 7,580,296 B2 | 8/2009 | Thorp et al. | |
| 7,583,555 B2 | 9/2009 | Kang et al. | |
| 7,779,281 B1 | 8/2010 | Brumett, Jr. et al. | |
| 7,797,083 B1 | 9/2010 | Brumett, Jr. et al. | |
| 7,885,905 B2 | 2/2011 | Heckerman et al. | |
| 2004/0037346 A1 | 2/2004 | Rusu et al. | |
| 2006/0020838 A1 | 1/2006 | Tschanz et al. | |
| 2006/0139820 A1 | 6/2006 | Ozawa et al. | |
| 2007/0043964 A1 | 2/2007 | Lim et al. | |
| 2007/0156370 A1 | 7/2007 | White et al. | |
| 2008/0104425 A1 | 5/2008 | Gunther et al. | |
| 2008/0282102 A1* | 11/2008 | Reddy et al. | 713/323 |
| 2008/0297233 A1 | 12/2008 | Tokunaga | |
| 2010/0083009 A1 | 4/2010 | Rotem et al. | |
| 2010/0213919 A1 | 8/2010 | Takayanagi et al. | |
| 2011/0074398 A1 | 3/2011 | Barton et al. | |
| 2011/0156693 A1 | 6/2011 | Dobberpuhl et al. | |
| 2011/0241725 A1 | 10/2011 | Ikenaga et al. | |
| 2012/0051395 A1 | 3/2012 | Chen et al. | |
| 2012/0054519 A1 | 3/2012 | Branover et al. | |
| 2012/0139624 A1* | 6/2012 | Senthinathan et al. | 327/540 |

OTHER PUBLICATIONS

Search Report for British Patent Application No. GB1303762.7 mailed Sep. 30, 2013.

* cited by examiner

*Primary Examiner* — Michael J Brown
(74) *Attorney, Agent, or Firm* — John W. Branch; Lowe Graham Jones PLLC

(57) ABSTRACT

An integrated circuit (IC) includes a first power supply node that is arranged to receive a first power supply signal. The IC also includes process detection circuits. Each process detection circuit provides a process detection output signal such that a value associated with the process detection output signal is a function of process variation at a location of the process detection circuit outputting the process detection signal. The IC also includes a processing unit that executes processor-executable instructions to provide at least one voltage control signal, based, at least in part, on the process detection signals. The voltage control signal(s) include a first voltage control signal is associated with a target voltage for the first power supply signal.

22 Claims, 2 Drawing Sheets

US 8,954,764 B2

METHOD AND APPARATUS FOR DYNAMIC POWER MANAGEMENT

TECHNICAL FIELD

The invention is related to power management, and in particular, but not exclusively, to a method and apparatus employing a processor to process information from process detectors about process variations on an integrated circuit for adjusting the power supply voltage(s) provided to the integrated circuit.

BACKGROUND

An integrated circuit (IC) is designed to meet the speed performance also in the worst case process corner. A ring oscillator may be placed on the IC and as a result of changes in the manufacturing process and operation conditions the frequency changes. A ring oscillator can be placed in a large IC for use as a process detection circuit for checking process variations.

BRIEF DESCRIPTION OF THE DRAWINGS

Non-limiting and non-exhaustive embodiments of the present invention are described with reference to the following drawings, in which.

DETAILED DESCRIPTION

Figure 1:
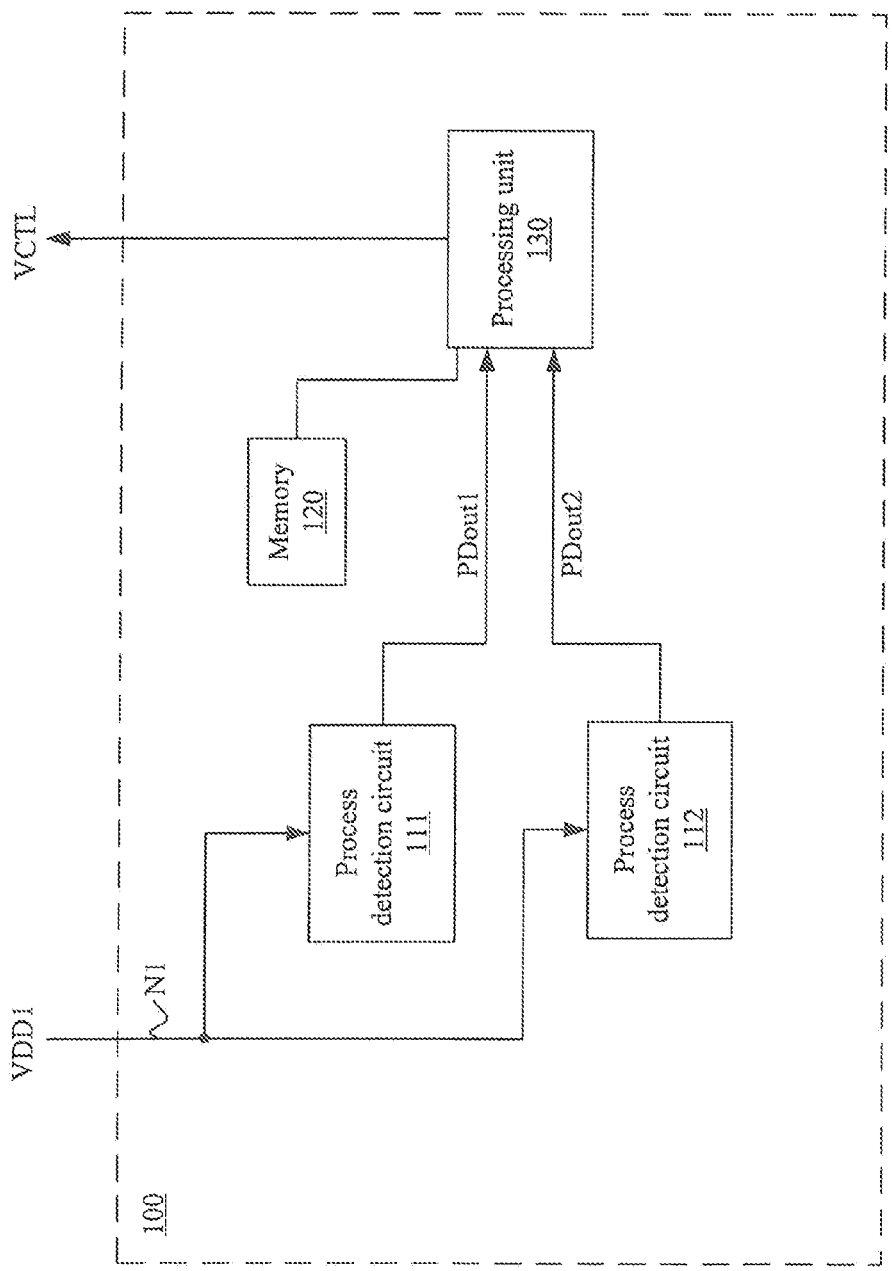
FIG. 1 illustrates a block diagram of an embodiment of an IC.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "signal" means at least one current, voltage, charge, temperature, data, or other signal.

Briefly stated, the invention is related to an IC that includes a first power supply node that is arranged to receive a first power supply signal. The IC also includes process detection circuits. Each process detection circuit provides a process detection output signal such that a value associated with the process detection output signal is a function of process variation at a location of the process detection circuit outputting the process detection signal. The IC also includes a processing unit that executes processor-executable instructions to provide at least one voltage control signal, based, at least in part, on the process detection signals. The voltage control signal(s) include a first voltage control signal is associated with a target voltage for the first power supply signal.

FIG. 1 illustrates a block diagram of an embodiment of IC 100. IC 100 includes power supply node N1, process detection circuit 111-112, memory 120, and processing unit 130.

Node N1 is arranged to receive first power supply signal VDD1. Each process detection circuit (e.g., 111-112) is arranged to provide a process detection output signal (e.g., PDout1-PDout2) such that a value associated with the process detection output signal (e.g., PDout1 or PDout2) is a function of process variation at a location of the process detection circuit outputting the process detection signal. Memory 120 is arranged to store at least processor-executable instructions, and a processing unit 130 executes the processor-executable instructions stored in memory 120 to provide at least one voltage control signal VCTL, based, at least in part, on the process detection signals (e.g., PDout). Voltage control signal VCTL may be digital or analog in various embodiments. Also, in various embodiments, memory 120 may be volatile or non-volatile memory. Voltage control signal(s) VCTL include a first voltage control signal VCTL1 that is associated with a target voltage for first power supply signal VDD1. In various embodiments, processing unit 130 may be a CPU or a microcontroller. In some embodiments, the inputs and outputs of processing unit 130 are on a shared data base.

Although not shown in FIG. 1, some embodiments of IC 100 further include a temperature detector and/or an analog-to-digital converter (ADC) for measuring the voltage VDD1, which provide temperature and/or voltage information to processing unit 130.

Also, although FIG. 1 shows memory 120 in IC 100, in some embodiments, memory 120 may be external to IC 100 and therefore excluded from IC 100.

Figure 2:
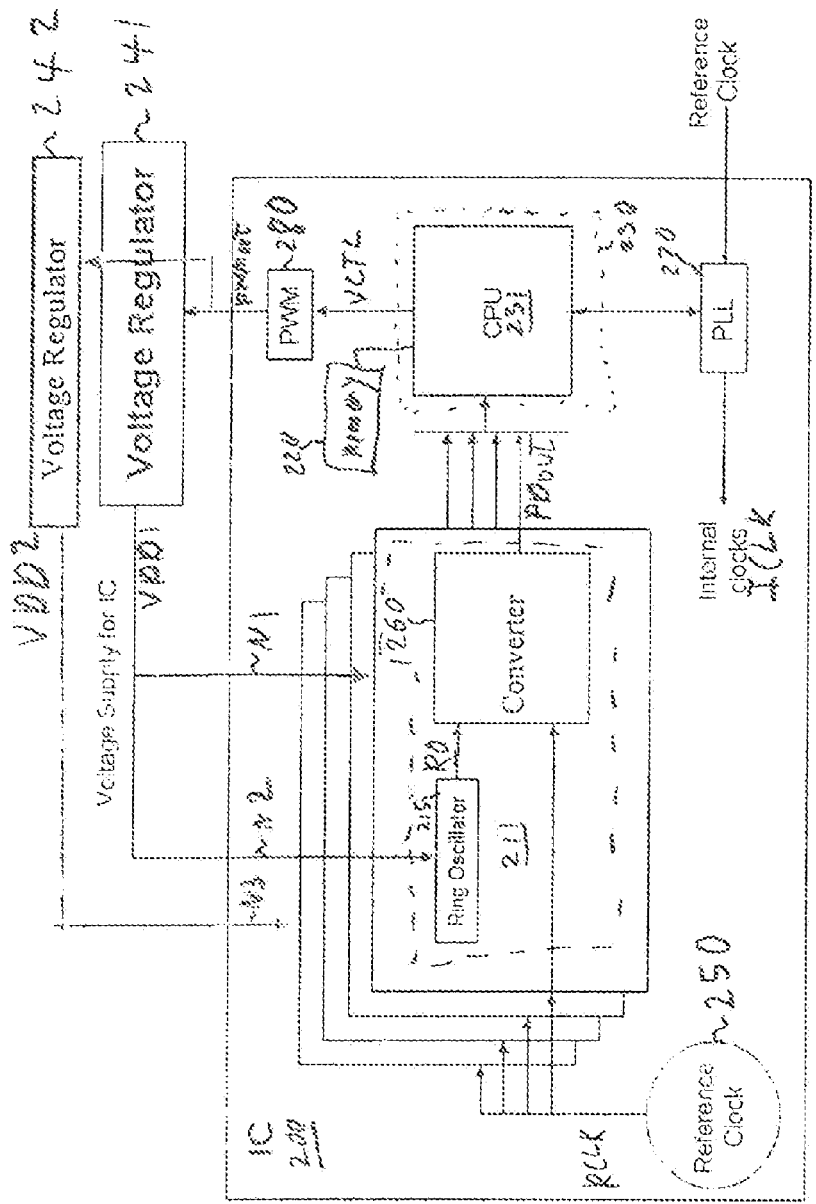
FIG. 2 shows a block diagram of an embodiment the IC of FIG. 1 and embodiments of voltage regulators, arranged in accordance with aspects of the invention.

FIG. 2 shows a block diagram of an embodiment IC 200, which may be employed as an embodiment of IC 100 of FIG. 1, and embodiments of voltage regulators (e.g., 241 and 242). IC 200 further includes reference clock generator 250, converter(s) 260, phase-locked loop (PLL) 270, pulse width modulator (PWM) 280, power supply node N2, and power supply node N3. IC 200 has multiple islands, in which at least a portion of the islands have their own process detection circuit 211 in some embodiments. In some embodiments, each process detection circuit 211 includes ring oscillator 215 and converter 260. Processor 230 includes CPU 231. In some embodiments, reference clock generator 250 is not included in IC 200, and instead an external reference clock signal is received by IC 200, or in other embodiments, the reference clock is generated by PLL 270.

The area of the IC 200 is partitioned into circuit areas/islands each having its own processor detector circuit (e.g., 211), for example, by having a ring oscillator (215) and a converter (260). In some embodiments, some islands may not have a process detector circuit, such as very small islands for which the designer does not care about power consumption savings for the island. In some embodiments, the output RO of each ring oscillator 215 is connected to a converter (260) that also receives a reference clock (RCLK), generated by reference clock generator 250 or received from PLL 270 or from an external source. While a single reference clock RCLK is shown FIG. 2, it should be understood that a plurality of reference clocks may be used without departing from the scope and spirit of the invention. The output of each converter 260, PDout, is read by CPU 231. Reading of such data may be done over a bus, using a serial connection such as a built-in self-test (BIST) chain, as well as other types of data transfer and without departing from the scope and spirit of the invention. In other embodiments, a converter (260) which translates the ring oscillator frequency value to a digital value is used which then allows the access of CPU 231 to the digital value, for example and without limitation, by reading it as a register that is connected to a bus. In some embodiments, the digital value correlates to the ratio between the ring oscillator and reference frequencies. Regardless of how the value is read by CPU 231, once available to CPU 231, that value can be manipulated for the purpose of generating voltage control signal(s) VCTL.

CPU 231 generates voltage control signal(s) VCTL to adjust the voltage regulator output voltage(s) (e.g., VDD1 and VDD2). In some embodiments, each voltage control signal in the voltage control signal(s) is a digital signal that is converted to an analog signal which adjusts the corresponding regulator output voltage (e.g., VDD1 or VDD2). In one embodiment, as shown in FIG. 2, but not by way of limitation, such digital-to-analog conversion is performed using pulse width modulation (PWM) (performed, for example, by pulse width modulator (PWM) 280 of FIG. 2), and low-pass filtering. In other embodiments, an analog-to-digital converter (ADC) is employed.

In some embodiments, the voltage regulator output voltage (e.g., VDD1 and/or VDD2) value can be programmed through a digital port. In these embodiments, CPU 231 adjusts the regulator output voltage(s) through a digital port instead of outputting an analog signal.

CPU 231 may be further connected to memory 220 for the purpose of reading values respective of each process detector (e.g., 211). For example, and without limitation, such data may include a factor value to allow a different reference value with respect to the sampled value of the processor detector (e.g., 211), a performance value to indicate the performance requirements of a circuit associated with the process detector (e.g., 211), and/or the like.

In some embodiments of IC 200, converter 260 is not included in IC 200. In some embodiments of IC 200 that do not include converter 260, CPU 231 executes instructions that perform steps for reading twice from a counter which is clocked by ring oscillator 215, where the second reading is done after a predefined timer timeout. In these embodiments, the difference between the ring oscillator readings correlates to the ratio of the ring oscillator frequency and the reference timer frequency.

In some embodiments, the converter value provided is with respect of a ratio of the frequency of the ring oscillator to a reference value, for example, the frequency of a reference clock RCLK. In some embodiments, one or more counters are employed to count cycles of the frequency of the ring oscillator output RO in a particular time period and of the reference clock RCLK in the time period, and the count values may be used to calculate a ratio of the frequency of RO to the frequency of reference clock RCLK. Or, rather than calculating a ratio, the difference between the number of RLCK cycles counted and PDout cycles counted may be employed. The comparison between the reference clock RCLK and the ring oscillator output PDout may be performed in many different ways in different embodiments, and may be performed in hardware, software, or both in various embodiments.

Then, based on parameters and other data stored in memory 220, as well as interaction of different circuits associated with the respective process detectors (e.g., ring oscillators 215), and/or temperature detectors and/or power supply detectors, CPU 231 provides voltage control signals VCTL to control the target output voltages (e.g., VDD1 and VDD2) of voltage regulator(s) (e.g., 241 and 242). For example, and without limitation, if a performance critical computation is performed on a circuit, then it may not be desirable to reduce its power consumption below a predefined level that is reflected by the indicator. By taking into account a plurality of parameters a more accurate control of the voltage regulator is achieved. Moreover, in some embodiments the voltage regulator(s) 241 and 242 provide multiple power supply voltages (e.g., VDD1 and VDD2) to a number of different circuits/islands each being monitored by a corresponding process detector 211. CPU 231 can adjust each of the control signals in voltage control signal(s) VCTL to cause the voltage regulator(s) (e.g., 241 and 242) to provide a different voltage (e.g., VDD1 and VDD2) appropriate to each circuit/island. In various embodiments, voltage control signal(s) VCTL may be provided directly to the voltage regulator(s) (e.g., 241 and 242), or via one or more intermediate device, such as PWM 280 in some embodiments. For example, in some embodiments, voltage control signal(s) VCTL are converted to analog signals via PWM (280) with external low pass filters(s), or via A/D converters in the case of programmable voltage regulators that CPU 231 can control through a digital port.

As discussed above, based on parameters and other data stored in memory 220, as well as interaction of different circuits associated with the respective process detectors (e.g., ring oscillators 215), and/or temperature detectors and/or power supply detectors, CPU 231 provides voltage control signals VCTL to control the target output voltages (e.g., VDD1 and VDD2) of voltage regulator(s) (e.g., 241 and 242). For example, each power supply detector may receive a corresponding power supply voltage (e.g., VDD1 or VDD2), and provide a power supply detector output signal such that the power supply detector output signal is a function of the power supply voltage received by the power supply detector. In some embodiments, as discussed above, each of the power supply detectors is an ADC.

An integrated circuit (IC) is designed to meet the speed performance also in the worst case process corner. Therefore in the typical and best performance process corner its power consumption will be significantly higher than in the worst case leading to power waste. The dynamic control of power supply voltage(s) (e.g., VDD1 and VDD2) provided by CPU 231 may be employed to reduce such power waste.

Each ring oscillator(s) 215 provide a signal RO which spontaneously oscillates at a frequency that changes as manufacturing process and operation conditions change. Each process detector (e.g., 211) provides signal PDOUT as a function of the ring oscillator frequency. CPU 231 employs a value associated with signal PDout to control voltage regulator(s) (e.g. 241 and 242) for the purpose of changing voltage(s) (e.g., VDD1 and VDD2) in a way that overall reduction in power is achieved. The various ring oscillators 215 may provide conflicting information. For example, if a first digital signal processor (DSP) circuit on the IC is being used and a second DSP circuit on the IC is not in use, and a single ring oscillator is used, it may indicate that the voltage can be reduced not noticing the need of the first circuit being used. In the case of multiple ring oscillators there may be opposing readings in some circumstances. Ring oscillators may be employed as process detection circuits for checking process variations. In some embodiments, process detection may instead be accomplished by analog circuitry such as, for example, a local current source that is compared to a reference current source. CPU 231 reconciles conflicting readings in its control of the voltage regulator(s) (e.g., 241 and 242).

The information from ring oscillators 215 is processed by CPU 231. In some embodiments, information from each ring oscillator 215 may be detected by means of a mere detection of a value using converter 260 at the process detector level, or, in some embodiments, the actual value of the process detector that can then be compared to one or more reference values, including but not limited to a reference clock RCLK (e.g., provided by reference clock generator 250, provided by PLL 270, or provided externally). In some embodiments, each ring oscillator 215 is used to clock a counter, and the process information can be determined by software means, with CPU 231 reading the counter and comparing a time difference value to a reference timer difference.

In addition, other parameters, that may be stored in memory 220 and accessible by the CPU 231, may be used for manipulating the sampled information. For instance, in a case of a conflict between the first and second digital signal processors (DSPs) such information of how much voltage reduction can be sustained by the first DSP without compromising a desired level of performance at a given period of time may be stored in memory 220 and allow the CPU 231 to control the voltage regulator (e.g., 241 or 242) more finally. Moreover, in some embodiments, it allows the control of multiple voltage regulators (e.g., 241 and 242) each used for a different circuit/ island. The control performed by CPU 231 further enables anticipation of a need for a higher or lower voltage depending on the expected performance requirement of IC 200 at a future time.

CPU 231 may employ a variety of different factors in providing signal voltage control signal(s) VCTL to dynamically control the voltage regulator(s) (e.g., 241 and 242). In addition to receiving information from the process detectors (e.g., 211), CPU 231 may receive information from temperature diode(s) (not shown) in IC 200, from power voltage detectors, reference clocks RCLK, timers, and/or other sources, and a decision making process based on data stored in memory 220 respective to the regulator voltage parameters per mode of operation which are a function of the CPU inputs. In the case of lower performance, the unit frequency can be lowered and therefore reduce the power voltage, so that parameters may be optimized per operation mode.

CPU 231 is arranged to provide voltage controls signals VCTL to control the voltage regulators (e.g., 241 and 242). CPU 231 provides this control by executing software stored in memory 220. The power control can be dynamically adjusted by using software. Because the power control is subject to software control, the dynamic power control of the power supply voltages provided by CPU 231 begins after boot.

Ring oscillators 215 are scattered across IC 200. Ring oscillators 215 are characterized across all process, voltage, and temperature conditions IC 200. In some embodiments, for each ring oscillator 215 there is a corresponding converter 260 which compares the oscillator frequency of signal RO to a reference clock RCLK provided by reference clock generator 250, and which outputs signal PDout to have a value that relates to the frequency ration between the signal RO and signal RCLK. In other embodiments, the frequency of RO is converted into a value, and CPU 231 periodically reads counter values and calculates the frequency ration between the oscillator and the CPU period and uses this to controls the voltage regulator(s) to meet operating conditions. In some embodiments, the voltage regulator feedback control is done using pulse width modulation (PWM) or A/D conversion. In other embodiments, as previously discussed, there is embedded in IC 200 one or more temperature detector(s) (not shown) and the value of that temperature is also accessible by CPU 231. For example, temperature detectors may include temperature diodes, which may be employed to detect the temperature at the location of the temperature diode. In addition, in some embodiments, CPU 231 can dynamically control the frequency of the internal clocks ICLK during low performance modes and therefore can reduce the IC power supply and save further on power consumption.

CPU 231 employs voltage control signal(s) VCTL to dynamically adjust the target output voltage provided by voltage regulator(s) (e.g., 241 and 242). This adjustment may be accomplished in different ways in different embodiments. In some embodiments, signals VCTL adjust the PWM duty cycle, and the PWM output, PWMout, is converted to an analog signal by a low pass filter, which is external in some embodiment, which is coupled to the feedback loop in the voltage regulator(s) (e.g., 241 and 242).

PLL 270 is arranged to generate internal clock signals ICLK from a reference clock signal and control from CPU 231, such that the frequency of internal clock signals ICLK are controlled by CPU 231. In addition to providing voltage control signals VCTL to control the voltage regulator(s) (e.g., 241 and 242), CPU 231 may also be employed to control the clock frequency of IC 200, by employing PLL 270 to adjust the frequency of one or more of internal clock signals ICLK of IC 200. CPU 231 may increase the clock frequency of ICLK in high performance modes, and decrease the clock frequency ICLK in low performance modes. For example, in embodiments in which IC 200 is employed in a digital camera, the clock frequency of ICLK may be decreased in camera preview mode, and increased in video recording mode. When the clock frequency ICLK is adjusted based on the operating mode, CPU 231 may also employ signal(s) VCTL to adjust the voltage regulator(s) based on the mode CPU 231 is currently in. Among other factors, CPU 231 determines the power supply voltages (e.g., VDD1 and VDD2) provided to IC 200 based on the requirements of the operating mode that IC 200 is in. In certain modes, the requirement may be lowered by lowering the clock frequency, so that the power supply voltage (e.g., VDD1 and/or VDD2) can then be lowered even more. In some embodiments, memory 220 includes calibration data by which, in conjunction with the frequency of signal PDout, the voltage supply that should be employed for the island can be calculated.

Although FIG. 2 shows two voltage regulators, 241 and 242, various embodiments may include only one voltage regulator, or may include three or more voltage regulators. Each voltage regulator (e.g., 241 and 242) provides a separate power supply signal (e.g., VDD1 and VDD2) responsive to control from CPU 231. In some embodiments, each voltage regulator (e.g., 241 and 242) receives a corresponding one of the voltage control signals from among voltage controls signals VCTL provided by CPU 231. For example, in some embodiments, a first voltage control signal in voltage control signals VCTL may control the target output voltage VDD1 of a first voltage regulator 241, a second voltage control signal in voltage control signals VCTL may control the target output voltage VDD2 of a second voltage regulator 242, and so forth. In other embodiments, as shown in FIG. 2, voltage control signals VCTL are provided to PWM 280 to adjust the duty signal of pulse width modulation output signals PWMout provided by PWM 280, which in turn in provided to a low pass filter and then to the voltage regulator(s) (e.g., 241 and 242) to control the target output voltages (e.g., VDD1 and VDD2) of the voltage regulator(s) (e.g., 241 and 242). In various embodiments, memory 220 may be volatile or nonvolatile, and may be internal or external to IC 200.

FIG. 2 shows an embodiment of IC 200 in which there are two voltage regulators, 241 and 242, with target output voltages controlled by CPU 231 after boot. In the embodiment illustrated in FIG. 2, IC 200 receives power supply voltage VDD1 at nodes N1 of a first island of IC 200 and N2 of a second island of IC 200, and receives power supply VDD2 at node N3 of a third island of IC 200.

Reference clock generator 250, pulse width modulator 280, converters 260, and PLL 270 are optional components that are not included in all embodiments IC 200. Also, although FIG. 2 shows two voltage regulators, 241 and 242, various embodiments may include only one voltage regulator, or may include three or more voltage regulators. Further, in some embodiments, the voltage regulators are internal to IC 200 rather than external. In some embodiment, instead of voltage regulators there is a power switch and voltage control signal VCTL is ON/OFF. Further, a microcontroller may be employed in place of CPU 231. Different numbers of islands may be employed in various embodiments. Also, in some embodiments, process detection circuits other than ring oscillators may be employed in place of ring oscillators 215. These embodiments and others are within the scope and spirit of the invention.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. An apparatus, comprising:
   an integrated circuit, including:
      a first power supply node that is arranged to receive a first power supply signal;
      a plurality of process detection circuits that is arranged to provide a plurality of process detection output signals, wherein each process detection circuit of the plurality of process detection circuits is arranged to provide a corresponding one of the plurality of process detection output signals such that a value associated with the process detection output signal is a function of process variation at a location of the process detection circuit outputting the process detection signal;
      a first process detection circuit of the plurality of process detection circuit that includes:
         a first ring oscillator that is arranged to provide a ring oscillator output signal: and
         a converter that is arranged to provide a first process detection output signal such that the first detection output signal is based, at least in part, on a ratio between a frequency associated with the ring oscillator output signal and a frequency associated with a reference clocks signal; and
      a processing unit that is arranged execute processor-executable instructions to provide at one voltage control signal including a first voltage control signal, based, at least in part, on the plurality of process detection output signals, such that the first voltage control signal is associated with a target voltage for the first power supply signal.

2. The apparatus of claim 1, wherein the processing unit is at least one of a central processing unit (CPU) or a microprocessor.

3. The apparatus of claim 1, wherein each of the process detection circuits includes a ring oscillator.

4. The apparatus of claim 1, wherein the processing unit is arranged to control the at least one voltage control signal further based on an operating mode of the integrated circuit.

5. The apparatus of claim 1, wherein the processing unit is further configured to control a frequency of each of at least one internal clock signal for the integrated circuit based on an operating mode of the integrated circuit, and wherein the processing unit is arranged to control the at least one voltage control signal further based on each frequency of each of the at least one internal clock signal.

6. The apparatus of claim 1, wherein the integrated circuit further includes:
   a temperature detector that is arranged to provide a temperature output signal that is a function of temperature at a location of the temperature detector, wherein the processing unit is further arranged to receive the temperature output signal, and wherein the processing unit is arranged to control the at least one voltage control signal further based on the temperature output signal.

7. The apparatus of claim 1, wherein the integrated circuit further includes:
   a plurality of temperature detectors, wherein each temperature detector of the plurality of temperature detectors is arranged to provide a corresponding temperature output signal that is a function of temperature at a location of the temperature detector, wherein the processing unit is further arranged to receive each of the temperature output signals, and wherein the processing unit is arranged to control the at least one voltage control signal further based on each of the temperature output signals.

8. The apparatus of claim 7, wherein each temperature detector of the plurality of temperature detectors includes a temperature diode.

9. The apparatus of Claim 1, wherein the integrated circuit further includes:
   a second power supply node that is arranged to receive a second power supply signal, wherein the at least one voltage control signal further includes a second voltage control signal that is associated with a target voltage for the second power supply signal.

10. The apparatus of clam 9, wherein
the integrated circuit includes:
   a first island that includes the first power supply node and a first process detection circuit of the plurality of process detection circuits: and
   a second island that includes the second power supply node and a second process detection circuit of the plurality of process detection circuit.

11. The apparatus of claim 1, wherein the integrated circuit further includes:
   a power supply detector that is arranged to provide a power supply detector output signal that is a function of the first power supply signal, wherein the processing unit is further arranged to receive the power supply detector output signal, and wherein the processing unit is arranged to control the at least one voltage control signal further based on the power supply detector output signal.

12. The apparatus of claim 1, wherein the converter that is arranged to provide the first process detection output signal by comparing a reference clock signal with the ring oscillator output signal.

13. The apparatus of claim 1, wherein the integrated circuit further includes:
   a voltage regulator that is arranged to provide the first power supply signal.

14. The apparatus of claim 1, wherein the integrated circuit further includes:
a memory that is arranged to store at least the processor-executable instructions.

15. The apparatus of claim 14, wherein the memory is volatile.

16. The apparatus of claim 14, wherein the memory is non-volatile.

17. The apparatus of claim 1, further comprising;
a memory that is arranged to store at least the processor-executable instructions, wherein the memory is external to the integrated circuit.

18. The apparatus of claim 17, wherein the memory is volatile.

19. The apparatus of claim 17, wherein the memory is non-volatile.

20. An apparatus, comprising;
an integrated circuit, including:
a first power supply node that is arranged to receive a first power supply signal;
a second power supply node that is arranged to receive a second power supply signal, wherein the at least one voltage control signal further includes a second voltage control signal that is associated with a target voltage for the second power supply signal;
a first island that includes the first power supply node and a first process detection circuit of the plurality of process detection circuits, and
a second island that includes the second power supply node and a second process detection circuit of the plurality of process detection circuit;
a plurality of ring oscillators that is arranged to provide a plurality of ring oscillator output signals, wherein each ring oscillator of the plurality of ring oscillators circuits is arranged to provide a corresponding one of the plurality of ring oscillator output signals, and wherein each of the plurality of process detection output signals is based, in part, on a corresponding one of the ring oscillator output signals ; and
a processing unit that is arranged execute the processor-executable instructions to provide at least one voltage control signal including a first voltage control signal, based, at least in part, on the plurality of process detection signals, such that the first voltage control signal is associated with a target voltage for the first power supply signal.

21. A method, comprising:
receiving, at an integrated circuit, a first power supply signal;
providing a plurality of process detection output signals, such that a value associated with each process detection output signal of the plurality of process detection output signal is a function of the process variation at a separate corresponding location in an integrated circuit;
receiving, at the integrated circuit, a ring oscillator output signal;
providing a first process detection output signal such that the first process detection output signal is based, at least in part , on a ratio between a frequency associated with the ring oscillator output signal and a frequency associated with a reference clock signal;
storing processor-executable instructions; and
executing the processor-executable instructions to provide at least one voltage control signal including a first voltage control signal, based, at least in part, on the plurality of process detection output signals, such that the first voltage control signal is associated with a target voltage for the first power supply signal.

22. An apparatus, comprising:
an integrated circuit including:
a first power supply node that is arranged to receive a first power supply signal;
at least one process detection circuit that is arranged to provide it least one process detection output signal, wherein each process detection circuit of the at least one process detection circuit is arranged to provide a corresponding one of the at least one process detection output signal such that a value associated with the process detection output signal is a function of process variation at a location of the process detection circuit outputting the process detection signal;
another process detection circuit that is arranged to include:
a first ring oscillator that is arranged to provide a ring oscillator output signal: and
a converter that is arranged to provide a first process detection output signal such that the first process detection output signal is based, at least in part on a ratio between a frequency associated with the ring oscillator output signal and a frequency associated with a reference clock signal: and
a microprocessor that is arranged to execute processor-executable instructions to determine and control a target voltage for the first power supply signal based, at least in part, on the at least one process detection output signal; and to determine and control a target clock frequency for the integrated circuit based, at least in part, on the at least one process detection output signal and an operating mode of the integrated circuit.

* * * * *